(12) United States Patent
Aubele

(10) Patent No.: US 7,684,131 B2
(45) Date of Patent: Mar. 23, 2010

(54) METHOD AND A DEVICE FOR POSITIONING AN ELEMENT IN AN OPTICAL SYSTEM

(75) Inventor: Karl-Eugen Aubele, Geislingen/Steige (DE)

(73) Assignee: Carl Zeiss SMT AG, Oberkochen (DE)

( * ) Notice: Subject to any disclaimer, the term of this patent is extended or adjusted under 35 U.S.C. 154(b) by 73 days.

(21) Appl. No.: 11/861,851

(22) Filed: Sep. 26, 2007

(65) Prior Publication Data

US 2008/0080070 A1    Apr. 3, 2008

(30) Foreign Application Priority Data

Sep. 29, 2006   (DE) .................. 10 2006 046 200

(51) Int. Cl.
*G02B 7/02* (2006.01)
*G02B 26/00* (2006.01)

(52) U.S. Cl. ...................................... 359/814; 359/290

(58) Field of Classification Search ......... 359/811–824, 359/198, 199, 223, 224, 290, 291, 296, 298
See application file for complete search history.

(56) References Cited

U.S. PATENT DOCUMENTS

| | | | |
|---|---|---|---|
| 6,366,387 B1 * | 4/2002 | Wilson | 359/237 |
| 6,924,915 B2 * | 8/2005 | Hirose et al. | 359/199.3 |
| 2002/0074529 A1 | 6/2002 | Aubele | |
| 2008/0308749 A1 * | 12/2008 | Butler | 250/492.1 |

FOREIGN PATENT DOCUMENTS

EP    1 209 502 B1    5/2002

* cited by examiner

*Primary Examiner*—Mohammed Hasan
(74) *Attorney, Agent, or Firm*—Fish & Richardson P.C.

(57) ABSTRACT

The disclosure generally relates to methods, devices, systems and components configured to position an element in a lens assembly, such as a lens assembly for microlithography, in which the element to be positioned is moved from an actual position to a target position via at least one actuator, and in which at least the positioning movement of the actuator is superimposed with an oscillating movement.

13 Claims, 1 Drawing Sheet

METHOD AND A DEVICE FOR POSITIONING AN ELEMENT IN AN OPTICAL SYSTEM

CROSS-REFERENCE TO RELATED APPLICATION

This application claims priority under 35 U.S.C. §119 to German patent application serial number 10 2006 046 200.9, filed Sep. 29, 2006, the contents of which are hereby incorporated by reference.

FIELD

The disclosure generally relates to methods, devices, systems and components configured to position an element in a lens assembly, such as a lens assembly for microlithography, in which the element to be positioned is moved from an actual position to a target position via at least one actuator, and in which at least the positioning movement of the actuator is superimposed with an oscillating movement.

BACKGROUND

In lens assemblies for microlithography applications, it can be desirable for the optical elements like filters, apertures, lenses, mirrors, prisms, to be positioned with high precision, such as, for example, in the nanometer range. In some instances, one or more optical elements can be replaceable elements (e.g., to adapt the imaging properties in different applications).

SUMMARY

In one aspect, the disclosure features a method that includes using an actuator to move an element from a first position to a target position by superpositioning movement of the actuator with an oscillating movement. The element configured to be used in an optical device. The oscillating movement is changed while moving the element, after moving the element, or both.

In another aspect, the disclosure features a method that includes moving an element from a first position to a target position using an actuator. The element is configured to be used in an optical device, and the target position is reached to within 5 nm and less.

In a further aspect, the disclosure features a device that includes an actuator configured to move an element, where the element is configured to be used in an optical device. The device also includes a unit configured to superimpose an oscillation onto the actuator, and a detection apparatus configured to detect the actual position of the element to be positioned. The device further includes a control unit configured so that the oscillation is changed as the element increasingly approaches a target position, after the element has reached the target position, or both.

In an additional aspect, the disclosure features a device that includes an actuator configured to move an element, where the element is configured to be used in an optical device. The device also includes a unit configured to superimpose an oscillation onto the actuator, and a detection apparatus configured to detect the actual position of the element. The device further includes a control unit. The device is configured so that the element can be positioned to within 5 nm of a target position.

In some embodiments, the disclosure provides systems, components and methods that can allow for relatively exact positioning/adjusting of an element in an optical system, like a lens assembly, such as a lens assembly for microlithography. In certain embodiments, positioning in the sub-µm-range can be achieved in a simple and efficient manner. This can, for example, improve service life of the actuators, while at the same time providing precision and exactness of positioning.

The oscillation, with which the actuator is provided, can be changed during and/or after the termination of a motion step. This can have the advantage that the oscillation that is provided to the actuator can be adapted, so that the oscillation is optimized, with reference to the service life of the actuator and the entire manipulation system. Additionally, also an optimization, with respect to the reduction of the interference influence of the oscillation signal upon the entire optical system and the element to be positioned, can be performed. Furthermore, the variation of the oscillation during and/or after ending a motion step has the advantage, that the oscillation can also be adjusted with respect to reaching the target position of the element to be positioned in an optimum manner. With an increasing approach of the element to be positioned to the target position, next to changing the parameters of the approach motion, also a change of the superimposed oscillation can be advantageous respectively.

The superimposed oscillation can lead to an oscillating movement of the actuator, or the respective moving part of the actuator, as e.g. of a moveable valve body, or pin, in a valve- or gas pressure controller, so that friction influences during the start motion, or slip effects can be avoided.

The present disclosure can be used for continuous approximation movements, e.g. through a PID controller (Proportional Integral Differential Controller), or for the stepwise approach method described in EP 1 209 502 B1. In a continuous approach movement, the entire approach movement from the actual position to the target position is considered a movement step, while the approximation movement can be formed by several, or through a plurality of different motion steps, during the stepwise approximation.

The change of the oscillation movement can relate to the change of the amplitude, the frequency, and/or the frequency form. Herein, all possible changes are viable, which serve to extend the service life of the actuator or parts thereof, and of the entire manipulator to position the optical element. Respective values can be determined through suitable test series in each particular case, since, depending on the application, various changes can be necessary. For example, it is conceivable, that low frequencies are desirable in certain systems, whereas very high frequencies can be advantageous in other systems.

As forms for possible oscillation movements sine oscillations, triangular oscillations, saw tooth oscillations, rectangular oscillations, or any kind of oscillation forms is conceivable.

The disclosure can be used, for example, with actuators, which only indirectly lead to the movement of the element to be positioned, like e.g. a moveable valve body of a gas pressure regulator for a pneumatic bearing- or positioning device. Thus, there is the possibility to filter out the oscillation, superimposed onto the actuator, when transposing the actuator movement into the element movement, so that the element to be positioned is not loaded by the imparted oscillation.

Accordingly a filter or damper element can be provided between the actuator and the element to be positioned, to filter out or damping interfering oscillations. However, such a component can also be left out, when the imparted oscillation is turned off after reaching the target position, or transposed into a non interfering form.

The actuator can be formed by respective valves, pressure controllers, electric motors, electric magnets, piezoelectric components, and/or combinations thereof, which provide the opportunity to superimpose the control system for the actuator with a respective oscillation, the so-called Ditter-signal.

The elements of an optical system, like of a lens array, that can be positioned, can include optical lenses, mirrors, prisms, filters, apertures, structured plates and the like. In some embodiments, an element can be a replaceable component.

The disclosure also provides a device (e.g., configured to perform a respective process) which has at least one actuator configured to move the element to be positioned, a detection apparatus configured to detect the actual position of the element to be positioned, a unit to impart or superimpose an oscillation onto the actuator and a control unit, which is provided, so that a respective change of the oscillation can be performed with an increasing and/or final approach of the actual position to the target position.

BRIEF DESCRIPTION OF THE FIGURES

Further characteristics and features will be apparent during the subsequent detailed description of an embodiment based on the appended figures, in which.

DETAILED DESCRIPTION

Figure 1:
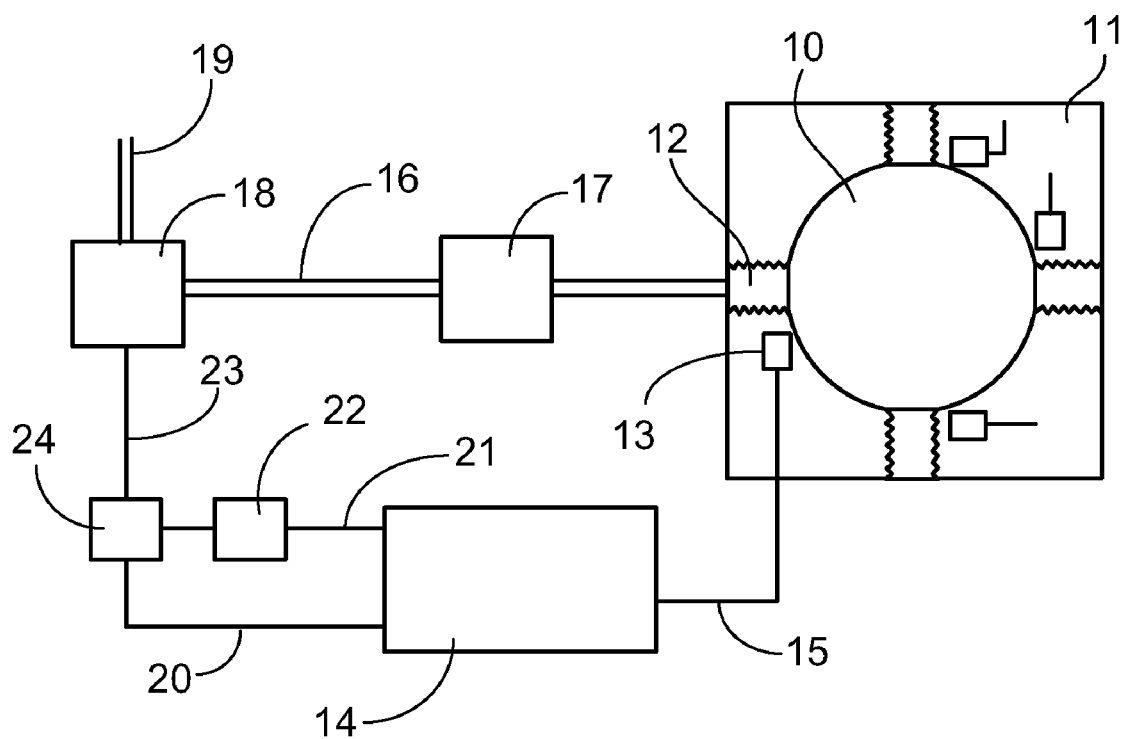
FIG. 1 a schematic drawing of a device configured to position an element in a lens assembly.

FIG. 1 shows a device to position an element in a lens assembly (e.g., a lens assembly for microlithography) in a purely schematic illustration. An optical element 10 (e.g., a lens) is received in a frame 11, and is moveably supported through pneumatic gaiters 12.

The gaiters 12 (of which only one is designated in FIG. 1, and which is used for description in an exemplary manner) are connected respectively through a gas, or air conduit 16 and 19 with a gas or compressed air supply which is not described in more detail.

Between the gas-, or compressed air supply, or in the conduit 16, a pressure controller is provided in the form of a valve 18, through which the pressure in the gaiters, and thus its expansion can be regulated. Through the gas pressure controller, thus through the gaiters 12, a positioning change of the optical element 10 can be realized. To determine the position of the optical element 10, or the expansion of the gaiters 12, a detector 13 is provided, which is connected with a control unit 14 through a signal conduit 15. The control unit 14 controls based on the predetermined target value of the position of the element 10 with reference to the gaiters 12 and to the actual state determined by the detector, the position of the gas pressure controller or the valve 18, functioning as an actuator through the control conduit 20.

In addition, the control unit 14, which can, for example, be a computer with respective software, generates an output signal to generate a superimposed oscillation, which is transmitted through the signal conduit 21 to the module 22 to generate the oscillation.

The module 22 to generate oscillations then generates a so-called Ditter signal according to the respective command of the control unit 14, wherein the Ditter signal is modulated onto the control signal for the gas pressure controller 18 in the modulation unit 24, in order to be finally handed over to the gas pressure controller 18 in the signal conduit 23. Through the control signal, superimposed with the Ditter signal, electric motors, electric magnets, or piezoelectric elements can be controlled to change the valve position of the pressure controller.

Through the superimposed oscillations, the moveable valve body constantly stays in motion, so that so-called slip stick effects can be avoided, when the motion of the valve body begins after a resting position, which can lead to a degradation of the positioning process.

In order not to transfer the oscillating motion to the optical element 10, a filter unit 17 is provided, which is used to filter out the oscillations, which the valve body or the gas pressure controller performs, in order to avoid slip stick effects.

Such a filter unit 17 can e.g. be provided through respectively selected openings, or through damper elements, like e.g. Helmholtz resonators.

The filter unit 17, however, can be dispensed with, when it is assured that after the positioning process, the oscillation or the so-called Ditter signal are equal to zero, or are located in a range, or occur in a manner, which are not critical for the application.

Instead of a gaiter 12, also, an air, or a gas bearing can be selected, which can be operated with a respective gas, as it already is present in the interior volume of the lens assembly, e.g. dried nitrogen.

In FIG. 1, the entire device is only illustrated with reference to one bearing element in the form of a gaiter 12, while, however, more bearing or positioning elements (e.g., four bearing or positioning elements) can be used in the form of gaiters 12. Respective components can be provided in these, wherein a single signal control unit can be provided for all these support- or positioning elements and the actuators connected therewith.

Instead of or in addition to the actuation of the optical element shown in the illustrated embodiments, also all other conceivable devices to operate or move an optical element in a lens assembly, like e.g. electric motors, piezoelectric elements, or similar can be used, as described e.g. also in EP 1 209 502 B1.

The device described in FIG. 1 now functions, so that through the detectors 13, the actual position of the optical element 10 is detected, which is transferred through the signal conduits 15 (only one is shown) to the control unit 14. In the control unit 14, the actual position is compared with the target position, and according to the control requirements suitable control signals for the gas pressure regulator 18 or the actuator are put out through the signal conduit 20. The control parameters can thus provide either for a step approach of the actual position to the target position according to EP 1 209 502 B1, or for a continuous approach according to a conventional control method (PID controller).

In any case, the control unit 14 provides an output signal to control the module configured to generate oscillation 22 through the signal conduit 21 depending on the comparison between actual position and target position. The module 22 generates an oscillation signal, which is superimposed to the control signal of the signal conduit 20 for the gas pressure controller 18 in the modulation unit 24, so that the moveable valve body determining the gas pressure in the gas pressure regulator performs an oscillating movement in addition to its movement to set the respective gas pressure, wherein the oscillating movement can avoid so-called slip stick effects while performing the movement, thus allowing an exact pressure setting and thus position adjustment of the optical element 10 through the gaiters 12.

The control unit 14 is thus provided, so that with an increasing approach of the element 10 to be positioned to the target position, the superimposed oscillation is changed with reference to the frequency, the amplitude, and/or the frequency form. In addition, after reaching the target position, an oscillation is set which is optimized for the service life of the actuator or the gas pressure regulator and/or for the interference free support of the optical element. Depending on the application, this can mean that the oscillation is set with very high or very low frequencies, with amplitudes approaching zero, and/or with certain frequency forms. For example, a very high frequency can be more advantageous under certain conditions through the inertia of the system and through avoiding respective friction effects at a certain amplitude, than a turned off oscillation with an amplitude equaling zero, in which through re-started movement of the respective actuator under certain conditions higher friction forces occur.

Figure 2:
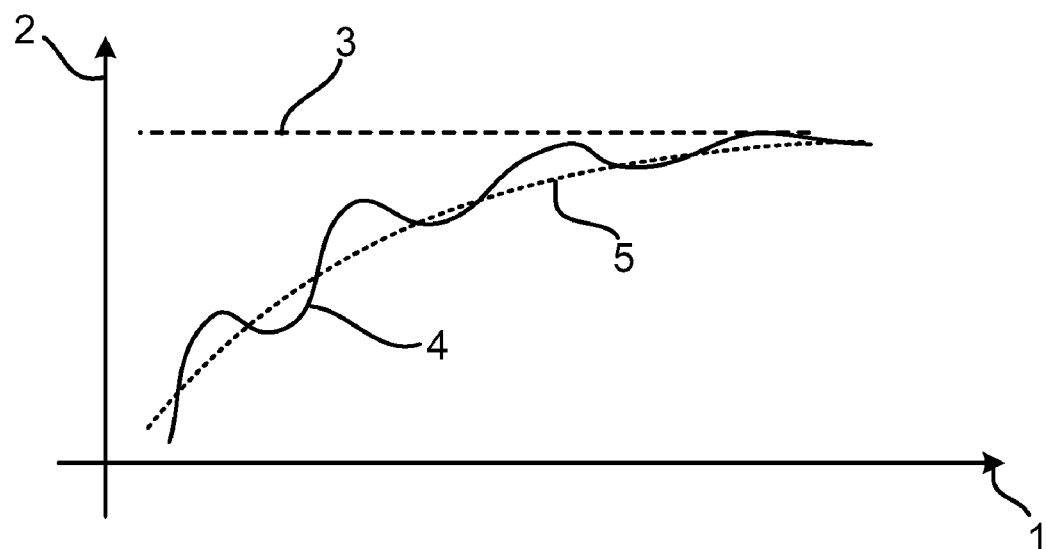
FIG. 2 a time distance diagram of an element to be positioned.

FIG. 2 shows the approach of a respective optical element to the target position in a time distance diagram, the target position being described by the broken illustration of the straight line 3.

FIG. 2 shows time on axis 1 and the location or the position on axis 2, wherein the straight line 3 represents the target position. The curve 5 hereby represents the approach of the element to be positioned to the target position 3, wherein the curve 4 represents the actual motion, which is generated through the overlap of the approach motion according to the curve 5 with the oscillation.

The information in FIG. 2 is also only to be regarded purely schematic, so that the magnitude of the amplitudes of the oscillation frequency, and of the form can differ significantly from the information in FIG. 2.

Through the superposition of the motion of an actuator to position an element with an oscillation, which is changed with increasing approach to the target position, and/or after terminating the approach motion, a precise and exact positioning of the element in the sub-μm-range becomes possible, wherein the service life of the moveable elements involved, and in particular of the actuators, can be optimized.

While certain embodiments have been described, other embodiments are also possible. As an example, some embodiments may involve the combination of certain features or the omission of certain features.

Other embodiments are in the claims.

What is claimed is:

1. A method, comprising:
    using an actuator to move an element from a first position to a target position by a positioning movement;
    using a control unit to generate an oscillation; and
    superimposing the positioning movement with an oscillating movement generated by the oscillation,
    wherein:
        the element configured to be used in an optical device for microlithography; and
        the oscillating movement is changed during the positioning movement, after the positioning movement, or both.

2. A method according to claim 1, wherein the element is moved incrementally or continuously.

3. A method according to claim 2, wherein the element is moved with different movement patterns that are performed in sequence.

4. A method according to claim 1, wherein the amplitude of the oscillating movement is changed.

5. A method according to claim 4, wherein the amplitude of the oscillating movement is reduced when approaching the target position, and the amplitude is approximately equal to zero or less at the target position.

6. A method according to claim 1, wherein the frequency of the oscillating movement is changed.

7. A method according to claim 6, wherein the frequency is adjusted during the progressing approach to the target position.

8. A method according to claim 1, wherein the form of the oscillating movement is changed.

9. A method according to claim 1, wherein the form of the oscillating movement is selected from the group consisting of sine-shaped oscillating movements, triangle-shaped oscillating movements, saw tooth-shaped oscillating movements and rectangular-shaped oscillating movements oscillations.

10. A method according to claim 1, wherein the movement of the actuator indirectly leads to the movement of the element.

11. A method according to claim 1, wherein the actuator is selected from the group consisting of pressure controllers, valves, electric motors, electric magnets, piezoelectric components, and combinations thereof.

12. A method according to claim 1, wherein the control signal for the actuator is superimposed with an oscillation.

13. A method according to claim 1, wherein the elements, which can be positioned, are selected from a group comprising optical lenses, mirrors, prism, apertures, structured plates, and generally replaceable elements.

* * * * *